United States Patent
Park et al.

(10) Patent No.: US 10,600,931 B2
(45) Date of Patent: Mar. 24, 2020

(54) AVALANCHE PHOTODIODE (71) Applicant: WOORIRO CO., LTD., Gwangju (KR)

(72) Inventors: Chan Yong Park, Gwangju (KR); Seoung Hwan Park, Daegu (KR)

(73) Assignee: WOORIRO CO., LTD., Gwangju (KR)

( * ) Notice: Subject to any disclaimer, the term of this patent is extended or adjusted under 35 U.S.C. 154(b) by 0 days.

(21) Appl. No.: 16/184,856

(22) Filed: Nov. 8, 2018

(65) Prior Publication Data

US 2019/0165201 A1 May 30, 2019

(30) Foreign Application Priority Data

Nov. 30, 2017 (KR) .................. 10-2017-0162473

(51) Int. Cl.
*H01L 31/107* (2006.01)
*H01L 31/0352* (2006.01)
*H01L 31/0304* (2006.01)

(52) U.S. Cl.
CPC .... *H01L 31/1075* (2013.01); *H01L 31/03048* (2013.01); *H01L 31/035236* (2013.01)

(58) Field of Classification Search
CPC .......... H01L 31/1075; H01L 31/03048; H01L 31/035236
See application file for complete search history.

(56) References Cited

U.S. PATENT DOCUMENTS

| | | | | |
|---|---|---|---|---|
| 5,912,478 A | * | 6/1999 | Barrou | H01L 31/1075 257/185 |
| 7,432,537 B1 | * | 10/2008 | Huntington | B82Y 20/00 257/186 |
| 2005/0029537 A1 | * | 2/2005 | D'Evelyn | H01L 31/022408 257/103 |
| 2007/0057144 A1 | * | 3/2007 | Asano | B82Y 10/00 250/200 |
| 2018/0033913 A1 | * | 2/2018 | Furuya | H01L 33/12 |
| 2018/0261717 A1 | * | 9/2018 | Rudolph | H01L 33/0062 |

* cited by examiner

*Primary Examiner* — Vongsavanh Sengdara
(74) *Attorney, Agent, or Firm* — Duane Morris LLP (57) ABSTRACT

An avalanche photodiode includes: a first contact layer; a light absorbing layer located on the first contact layer and having a multi-quantum well structure; a first electric field control layer located on the light absorbing layer; and a carrier multiplication layer located on the first electric field control layer. At least one of the multi-quantum well structure includes a well layer that includes $Ga_{1-x}Al_xN$ ($0 \leq X \leq 0.3$), and a barrier layer that includes $Ga_{1-x}Al_xN$ ($0.7 \leq X \leq 1$) and a doping portion doped with a p-type dopant.

10 Claims, 6 Drawing Sheets

AVALANCHE PHOTODIODE

CROSS-REFERENCE TO RELATED APPLICATION

This application claims priority to Korean Patent Application No. 10-2017-0162473, filed on Nov. 30, 2017, in the Korean Intellectual Property Office (KIPO), the disclosure of which is incorporated by reference herein in its entirety.

1. TECHNICAL FIELD

Embodiments of the present invention relate to an avalanche photodiode ("APD") for photon detection used in quantum cryptography communications, e.g., quantum key distribution ("QKD"), and the application thereof, and more particularly, to an avalanche photodiode for photo detection that includes a light absorbing layer having a quantum well structure of a nitride-based semiconductor having a large band gap.

2. DISCUSSION OF RELATED ART

With the development of information communication technologies including quantum cryptography communications, e.g., quantum key distribution, the importance of techniques for detecting weak optical signals at a single photon level has increased.

In the case of a single photon detector that is capable of detecting a weak optical signal such as a single photon, an avalanche photodiode is largely used as a light receiving element.

The avalanche photodiode amplifies a significantly weak current signal, triggered by one electron generated by a single photon, by several ten thousand to several hundred thousand times through avalanche multiplication. In such a case, in order to output a sufficiently large current pulse, the avalanche photodiode operates at a bias voltage higher than a breakdown voltage VB.

The operation of the avalanche photodiode at a voltage higher than the breakdown voltage VB is called a Geiger-mode operation, and an avalanche photodiode that operates in a Geiger mode is called a Geiger-mode avalanche photodiode ("GM-APD").

When an avalanche photodiode operates in a Geiger mode, a significantly large current flows across a multiplication layer of the Geiger-mode avalanche photodiode, and the avalanche photodiode may be seriously damaged. Accordingly, the avalanche photodiode is operated in the Geiger mode only for a short gate period, and a method of applying a bias voltage only for a short time to obtain significantly large amplification is called a gated mode.

Figure 1:
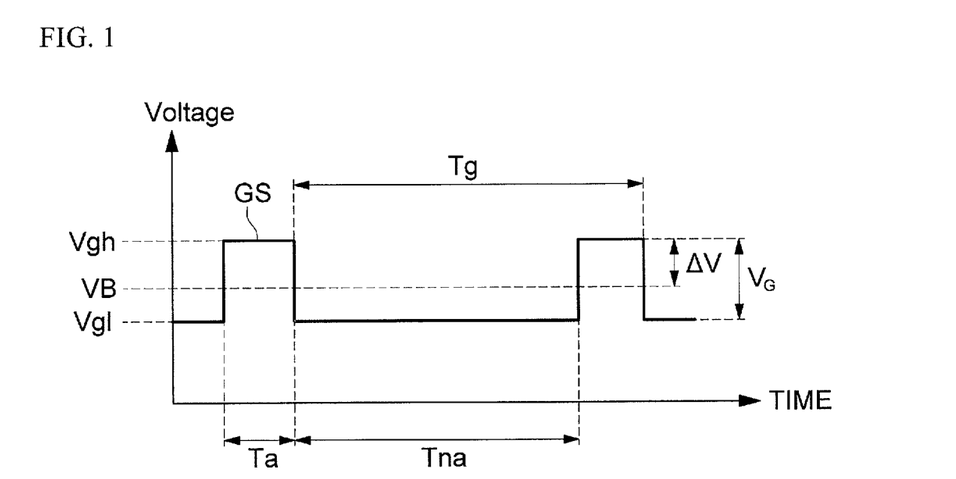
FIG. 1 is a view illustrating a waveform of a gate signal for an avalanche photodiode.

FIG. 1 is a view illustrating a waveform of a gate signal GS.

As illustrated in FIG. 1, the gated mode is a mode in which a voltage substantially equal to or higher than a breakdown voltage VB is input to an avalanche photodiode only when an optical signal is input to the avalanche photodiode, and the avalanche photodiode is operated at a voltage slightly lower than the breakdown voltage VB at other times. It is not that a single photon is incident to every gate. A section at which the voltage is raised for a short time is called a gate, and a gate frequency, which is the frequency of the gate, is an operating speed. Generally, the gate frequency may be from several ten megahertz (MHz) to several gigahertz (GHz).

The gate signal GS is maintained at a first voltage Vgh during an activation period Ta, and is maintained at a second voltage Vgl during an inactivation period Tna except for the activation period Ta. In other words, the gate signal GS is maintained at the first voltage Vgh that is higher than a DC voltage during the activation period Ta, and is maintained at a second voltage Vgl that is lower than the first voltage Vgh during the inactivation period Tna.

The second voltage Vgl of the gate signal GS corresponds to the above-described DC voltage Vdc, that is, a bias voltage.

In FIG. 1, "VG" denotes an amplitude of the gate signal GS, and "ΔV" denotes a difference voltage ΔV (i.e., an absolute value of the difference voltage) between the breakdown voltage VB and the gate signal GS (i.e., the first voltage Vgh of the gate signal GS), where the difference voltage ΔV refers to an over bias voltage. In addition, "Tg" means one period of the gate signal GS.

When a single photon signal is incident to the Geiger mode avalanche photodiode at the gate period and a carrier (an electron-hole pair) is generated, an electron or a hole is incident to the multiplication layer to be multiplied by the avalanche mechanism. In such a case, when a carrier that has been thermally generated in the semiconductor is multiplied at the gate period, a signal based on the thermally generated carrier may not be distinguished from an amplified signal based on the carrier that has been generated by the incident single photon, and thus it may act as noise. A probability that a dark current in a gate pulse acts as a noise is called a dark count probability per gate ("DCP"). In the quantum cryptography communications, this noise should be suppressed to about 0.001% ($10^{-5}$) or less per gate.

In order to reduce the dark count noise, it is essential to reduce the thermally generated current. In order to reduce the thermally generated current, thermal carrier generation should be suppressed by lowering an operating temperature of a detector, or a material having a significantly large band gap should be selected to make thermal generation difficult. However, materials having a large band gap are generally excluded from consideration because they cannot absorb light having wavelengths that are used for the quantum cryptography communications.

In order to lower the operating temperature of the detector, a thermoelectric cooling element ("TEC") is most widely used to lower the temperature. However, this method is disadvantageous in that a package required for embedding the thermoelectric cooling element in a photodetector module is expensive, and the price of packaging considering hermetic sealing is quite high. In addition, since a temperature control element should be operated continuously, the operation cost increases.

On the other hand, if the thermoelectric cooling element is mounted on the outside of the photodetector module, it is much more advantageous in terms of price, but an electric short circuit may occur due to water condensation, thus causing inconvenience of operation stop and defrosting.

It is to be understood that this background of the technology section is intended to provide useful background for understanding the technology and as such disclosed herein, the technology background section may include ideas, concepts or recognitions that were not part of what was known or appreciated by those skilled in the pertinent art prior to a corresponding effective filing date of subject matter disclosed herein.

SUMMARY

Aspects of embodiments of the present invention may be directed to an avalanche photodiode that operates at room temperature and has low dark current noise.

In addition, aspects of embodiments of the present invention may be directed to a single photon avalanche diode ("SPAD") that is capable of operating at room temperature with low dark current noise in the absence of a thermoelectric cooling element by absorbing light through the use of a nitride-based semiconductor having a significantly large band gap and substantially minimizing noise due to dark current.

According to an embodiment, an avalanche photodiode includes: a first contact layer; a light absorbing layer located on the first contact layer and having a multi-quantum well structure; a first electric field control layer located on the light absorbing layer; and a carrier multiplication layer located on the first electric field control layer. At least one of the multi-quantum well structure includes a well layer that includes $Ga_{1-x}Al_xN$ ($0 \leq X \leq 0.3$), and a barrier layer that includes $Ga_{1-x}Al_xN$ ($0.7 \leq X \leq 1$) and a doping portion doped with a p-type dopant.

The doping portion may have a surface charge density in a range from about $0.1 \times 10^{12}$ cm$^{-2}$ to about $3 \times 10^{12}$ cm$^{-2}$.

The well layer may have a thickness in a range from about 10 Å to about 20 Å, and the barrier layer may have a thickness in a range from about 15 Å to about 40 Å.

The well layer may have a band gap in a range from about 3.4 eV to about 3.959 eV, and the barrier layer may have a band gap in a range from about 5.048 eV to about 6.015 eV.

The multi-quantum well structure may have a thickness in a range from about 200 Å to about 1000 Å.

The carrier multiplication layer may include $Ga_{1-x}Al_xN$ ($0 \leq X \leq 1$) that is not doped.

The first electric field control layer may include $Ga_{1-x}Al_xN$ ($0 \leq X \leq 1$) that is p-type.

The first contact layer may include $Ga_{1-x}Al_xN$ ($0 \leq X \leq 1$).

The avalanche photodiode may further include a second electric field control layer located on the carrier multiplication layer.

The avalanche photodiode may further include a second contact layer located on the second electric field control layer.

The foregoing is illustrative only and is not intended to be in any way limiting. In addition to the illustrative aspects, embodiments and features described above, further aspects, embodiments and features will become apparent by reference to the drawings and the following detailed description.

BRIEF DESCRIPTION OF THE DRAWINGS

A more complete appreciation of the present invention will become more apparent by describing in detail embodiments thereof with reference to the accompanying drawings, wherein.

DETAILED DESCRIPTION

Embodiments will now be described more fully hereinafter with reference to the accompanying drawings. Although the invention may be modified in various manners and have several embodiments, embodiments are illustrated in the accompanying drawings and will be mainly described in the specification. However, the scope of the invention is not limited to the embodiments and should be construed as including all the changes, equivalents and substitutions included in the spirit and scope of the invention.

In the drawings, thicknesses of a plurality of layers and areas are illustrated in an enlarged manner for clarity and ease of description thereof. When a layer, area, or plate is referred to as being "on" another layer, area, or plate, it may be directly on the other layer, area, or plate, or intervening layers, areas, or plates may be present therebetween. Conversely, when a layer, area, or plate is referred to as being "directly on" another layer, area, or plate, intervening layers, areas, or plates may be absent therebetween. Further when a layer, area, or plate is referred to as being "below" another layer, area, or plate, it may be directly below the other layer, area, or plate, or intervening layers, areas, or plates may be present therebetween. Conversely, when a layer, area, or plate is referred to as being "directly below" another layer, area, or plate, intervening layers, areas, or plates may be absent therebetween.

The spatially relative terms "below," "beneath," "lower," "above," "upper" and the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in the other direction and thus the spatially relative terms may be interpreted differently depending on the orientations.

Throughout the specification, when an element is referred to as being "connected" to another element, the element is "directly connected" to the other element, or "electrically connected" to the other element with one or more intervening elements interposed therebetween. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

It will be understood that, although the terms "first," "second," "third," and the like may be used herein to describe various elements, these elements should not be limited by these terms. These terms are only used to distinguish one element from another element. Thus, "a first element" discussed below could be termed "a second element" or "a third element," and "a second element" and "a third element" may be termed likewise without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined at the present specification.

Some of the parts which are not associated with the description may not be provided in order to specifically describe embodiments of the present invention and like reference numerals refer to like elements throughout the specification.

In general, quantum cryptography communications is carried out through the use of optical fibers or free space (e.g., free space optical communications), and the quantum cryptography communications using optical fibers is most widely used. In the case of optical fiber transmission, a wavelength causing the smallest loss in the optical fiber is about 1550 nm, and thus a long distance optical communication scheme takes place at the wavelength of about 1550 nm. This is because it is economical to use a low-loss wavelength for long distance transmission, as the number of systems to be installed may be reduced.

An avalanche photodiode includes a light absorbing layer capable of absorbing photons having a wavelength of about 1550 nm. A photon energy with respect to the wavelength of 1550 nm is determined by the following equation.

$$E_g(\text{eV}) = \frac{1.24}{\lambda(\mu m)} = \frac{1.24}{1.55} \cong 0.8 \text{ eV}$$

Accordingly, it is necessary that a conventional avalanche photodiode uses a semiconductor that has a band gap energy less than about 0.8 eV as a light absorbing layer material. In such a case, when the band gap energy of the light absorbing layer is relatively small, dark currents increase due to thermal generation. That is, a probability of the dark current occurrence is inversely proportional to an exponential function of the band gap energy, as shown in the following equation.

$$i_D \propto \exp(-E_g)$$

Accordingly, as the band gap energy of the light absorbing layer increases, the probability of the dark current occurrence decreases exponentially. However, when the band gap of the light absorbing layer is relatively large, photons having the wavelength of about 1550 nm may not be absorbed so it is important to provide a solution to this issue.

A conventional InGaAs/InP avalanche photodiode has a separate absorption and multiplication ("SAM") structure in which carrier multiplication is carried out at InP (Eg=1.35 eV) and light absorption at InGaAs (Eg=0.75 eV). Since InGaAs having a relatively small band gap is used in the absorbing layer, the conventional InGaAs/InP avalanche photodiode can be used in a quantum key distribution system when a temperature is lowered by using a thermoelectric cooling ("TEC") element to reduce dark current noise.

Hereinafter, an avalanche photodiode according to an embodiment of the present invention will be described in detail with reference to FIGS. 2 to 7B.

Figure 2:
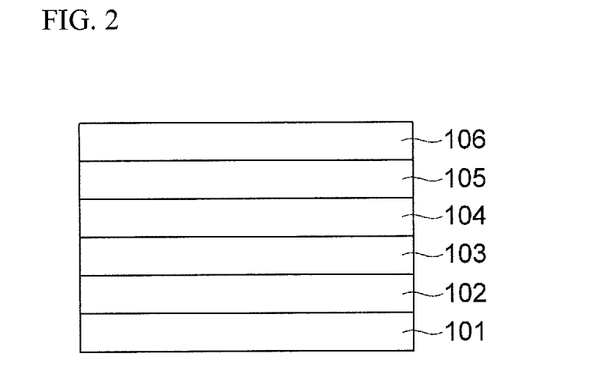
FIG. 2 is a cross-sectional view illustrating an avalanche photodiode according to an embodiment of the present invention.

FIG. 2 is a cross-sectional view illustrating an avalanche photodiode according to an embodiment of the present invention.

Referring to FIG. 2, an avalanche photodiode according to an embodiment of the present invention includes a first contact layer 101, a light absorbing layer 102, a first electric field control layer 103, and a carrier multiplication layer 104.

In addition, the avalanche photodiode according to an embodiment of the present invention may further include a second electric field control layer 105 and a second contact layer 106.

The first contact layer 101 may be a conductive layer including $Ga_{1-x}Al_xN$ (0≤X≤1) that is n-type.

The light absorbing layer 102 is located between the first contact layer 101 and the first electric field control layer 103.

The light absorbing layer 102 has a multi-quantum well structure.

The light absorbing layer 102 has at least one quantum well structure that includes a well layer including $Ga_{1-x}Al_xN$ (0≤X≤0.3) and having a thickness in a range from about 10 Å to about 20 Å, and a barrier layer including $Ga_{1-x}Al_xN$ (0.7≤X≤1) and having a thickness in a range from about 15 Å to about 40 Å.

The first electric field control layer 103 may include $Ga_{1-x}Al_xN$ (0≤X≤1) that is n-type.

The carrier multiplication layer 104 multiplies carriers provided from the light absorbing layer 102.

The carrier multiplication layer 104 is located on the first electric field control layer 103.

The carrier multiplication layer 104 may be a multiplication layer that includes $Ga_{1-x}Al_xN$ (0≤X≤1) that is not doped.

The second electric field control layer 105 is located on the carrier multiplication layer 104.

The second electric field control layer 105 may include $Ga_{1-x}Al_xN$ (0≤X≤1) that is n-type.

The second contact layer 106 is located on the second electric field control layer 105.

The second contact layer 106 may include $Ga_{1-x}Al_xN$ (0≤X≤1) that is n-type.

Figure 3:
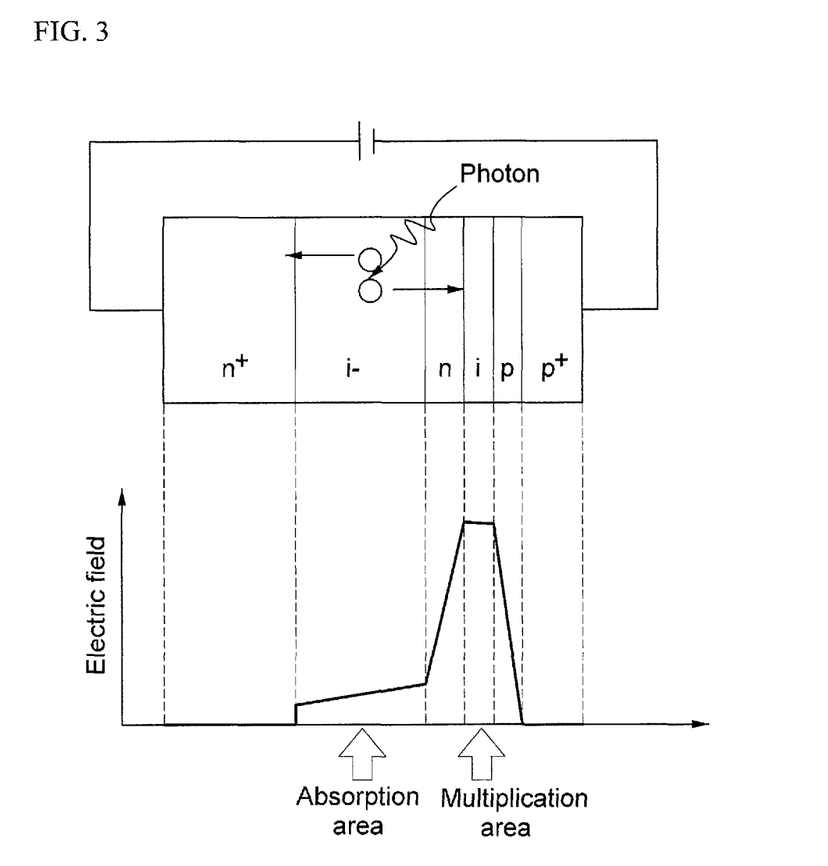
FIG. 3 is a block diagram illustrating a structure of a general avalanche photodiode.

FIG. 3 is a block diagram illustrating a structure of a general avalanche photodiode. Because the light absorbing layer and the multiplication layer are separated, it is called a separate absorption and multiplication structure. In the separate absorption and multiplication structure, because a significantly great electric field should be applied to the multiplication layer, the multiplication layer includes a material having a relatively large band gap in order to substantially prevent an increase in dark currents due to tunneling. In addition, the absorbing layer includes a semiconductor material having a band gap less than a wavelength energy to be absorbed. As a representative example, in a single photon detector, InP (Eg=1.35 eV) is used in the multiplication layer, and InGaAs (Eg=0.75 eV) is used in the absorbing layer. Since a band gap energy of the semiconductor material used in the light absorbing layer of the conventional avalanche photodiode is relatively small, electrons or holes that are thermally generated move to the multiplication layer to generate a current, which acts as noise.

Figure 4:
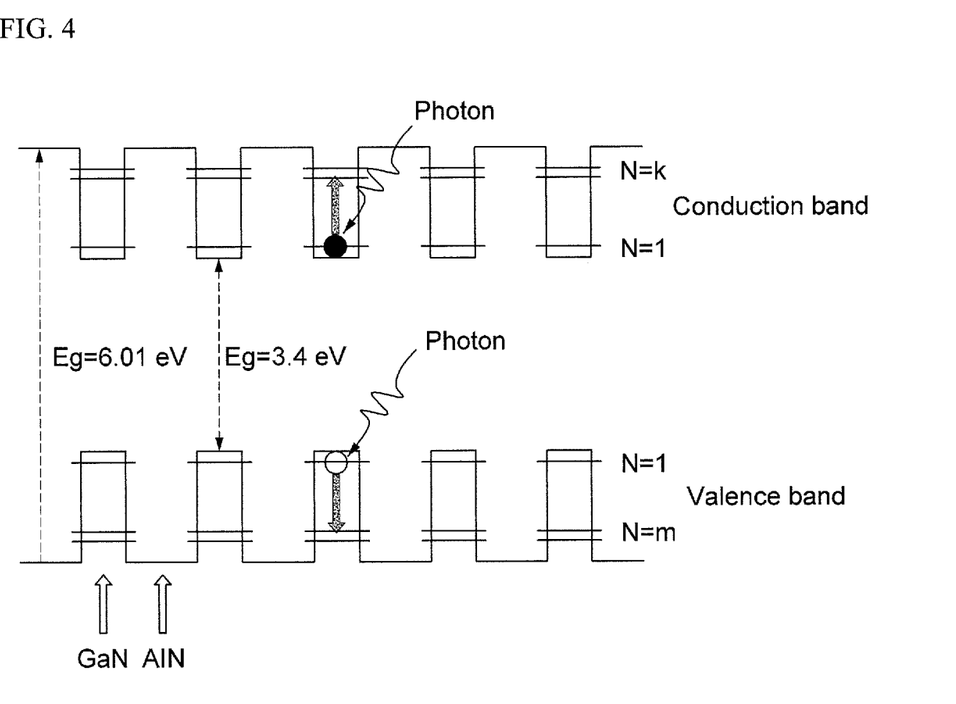
FIG. 4 is a view illustrating energy bands of a quantum well structure of a light absorbing layer according to an embodiment of the present invention.

FIG. 4 is a view illustrating energy bands of a quantum well structure of the light absorbing layer according to an embodiment of the present invention.

The barrier layer of the light absorbing layer 102 according to an embodiment of the present invention may include $Ga_{1-x}Al_xN$ (0.7≤X≤1) and may have a thickness in a range from about 15 Å to about 40 Å.

The well layer of the light absorbing layer 102 according to an embodiment of the present invention may include $Ga_{1-x}Al_xN$ (0≤X≤0.3) and have a thickness in a range from about 10 Å to about 20 Å.

When the barrier layer includes AlN, the barrier layer has a band gap of about 6.015 eV, and when the well layer includes GaN, the well layer has a band gap of about 3.4 eV.

When the barrier layer includes $Ga_{1-x}Al_xN$ (0.7≤X≤1), the barrier layer has a band gap in a range from about 5.048 eV to about 6.015 eV, and when the well layer includes $Ga_{1-x}Al_xN$ (0≤X≤0.3), the well layer has a band gap in a range from about 3.4 eV to about 3.959 eV. In such a case, the barrier layer has a band gap higher than that of the well layer as well.

When intersubband ("ISB") light absorption is carried out through the use of the quantum well structure with a semiconductor having a significantly large band gap, an optical signal of a desired wavelength may be absorbed while reducing the dark current noise.

Referring to FIG. 4, when GaN having a band gap that is significantly large but less than a band gap of a material forming the barrier layer is used in the well layer, AlN that has a significantly large band gap is used in the barrier layer, and the well layer has a thickness of several angstroms (Å) to several tens of angstroms (Å), a sub-band energy is generated by quantum effects in a quantum well layer, and light may be absorbed using energy transition of the sub-band. This phenomenon is called ISB absorption. As illustrated in FIG. 4, the ISB absorption may occur in both of a conduction band and a valence band.

Since GaN has a band gap energy of about 3.4 eV and AlN has a significantly large band gap energy of about 6.015 eV, the dark current noise that is thermally generated by ISB absorption in the valance band has a significantly small value.

Figure 5:
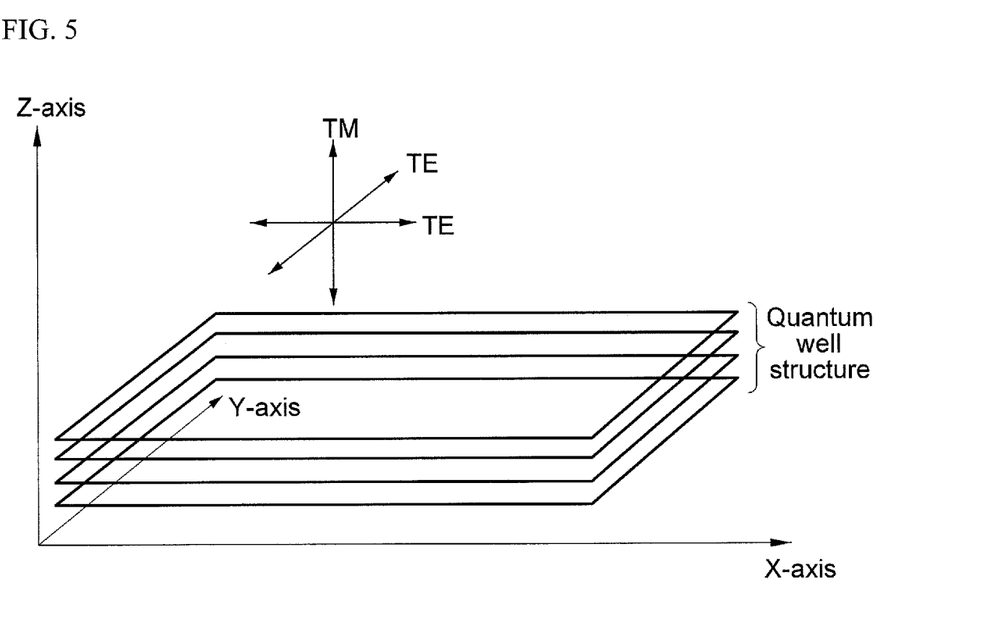
FIG. 5 is a view illustrating a quantum well structure and a polarization direction according to a direction of oscillation of an electric field.

FIG. 5 is a view illustrating a quantum well structure and a polarization direction according to a direction of electric field oscillation.

It is well defined by Maxwell that when a photon advances in space, the electric field and the magnetic field oscillate in the direction perpendicular to the propagation direction of the photon.

As illustrated in FIG. 5, a TM mode is defined as a mode in which the electric field oscillates along a z-axis. In order to allow a photon to be incident in the TM mode, the photon needs to be incident parallel to an x-y plane that is parallel to a growth surface of the quantum well structure.

On the other hand, a TE mode is defined as a mode in which the electric field oscillates in parallel to the x-y plane. When the photon is incident perpendicular to the growth surface of the quantum well structure, that is, perpendicular to the x-y plane, the electric field oscillates parallel to the growth surface of the quantum well structure.

In general, a photodetector is designed for light to enter along the z-axis. It means that in such a photodetector, the photon is incident in the TE mode. That is, the electric field oscillates in a direction of a crystallographic plane constituting the quantum well structure In general, ISB absorption occurs along the z-axis direction based on a small thickness of the quantum well layer. Accordingly, when the photon is incident in the TE mode, the ISB absorption may not be caused due to bulk effects. Accordingly, as a method of introducing photons in the TM mode to cause ISB absorption, a lattice is formed on a surface of the photodetector to cause the photon to oscillate in the z-axis, but this method does not show much effects because conversion efficiency in the z-axis direction is not large. The fundamental reason why high conversion efficiency may not be obtained by this method is that ISB transition is only used in the conduction band.

Figure 6:
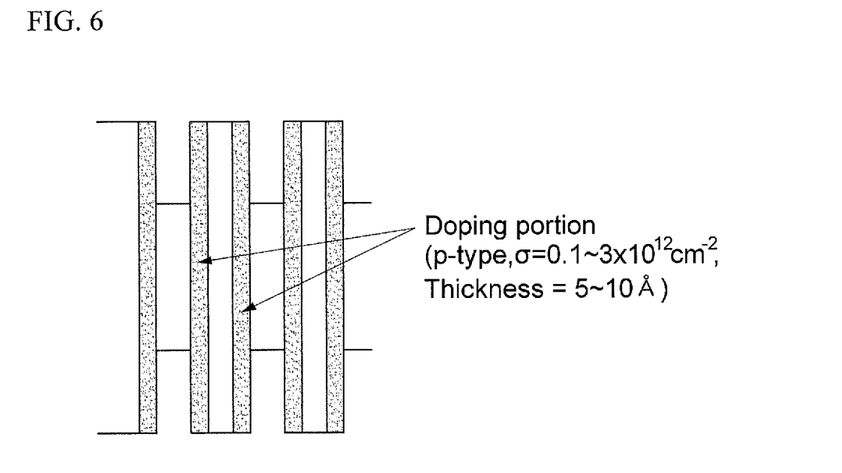
FIG. 6 is a view illustrating a doping structure for increasing a light absorptance in a quantum well structure of a light absorbing layer according to an embodiment of the present invention.

FIG. 6 is a view illustrating a doping structure for increasing a light absorptance in the quantum well structure of the light absorbing layer according to an embodiment of the present invention.

The quantum well structure of the light absorbing layer according to an embodiment of the present invention shows high light absorption efficiency by ISB transition in the valence band using a GaN/AlN semiconductor that has a Wurtzite structure. That is, the quantum well structure of the light absorbing layer according to an embodiment of the present invention may show a high light absorptance in the TE mode in which a light signal is incident in a direction of the growth of the quantum well by performing ISB transition in the valence band.

The well layer may include $Ga_{1-x}Al_xN$ (0≤X≤0.3) and have a thickness in a range from about 10 Å to about 20 Å.

The barrier layer may include $Ga_{1-x}Al_xN$ (0.7≤X≤1) and have a thickness in a range from about 15 Å to about 40 Å.

Referring to FIG. 6, the barrier layer includes a p-type doping portion in at least one of opposite directions. Accordingly, the doping portion of the barrier layer has a surface charge density in a range from about $0.1 \times 10^{12}$ cm$^{-2}$ to about $3 \times 10^{12}$ cm$^{-2}$ in order to provide a large number of holes to the valence band. As used herein, the surface charge density is defined as "layer thickness×doping concentration".

Figure 7:
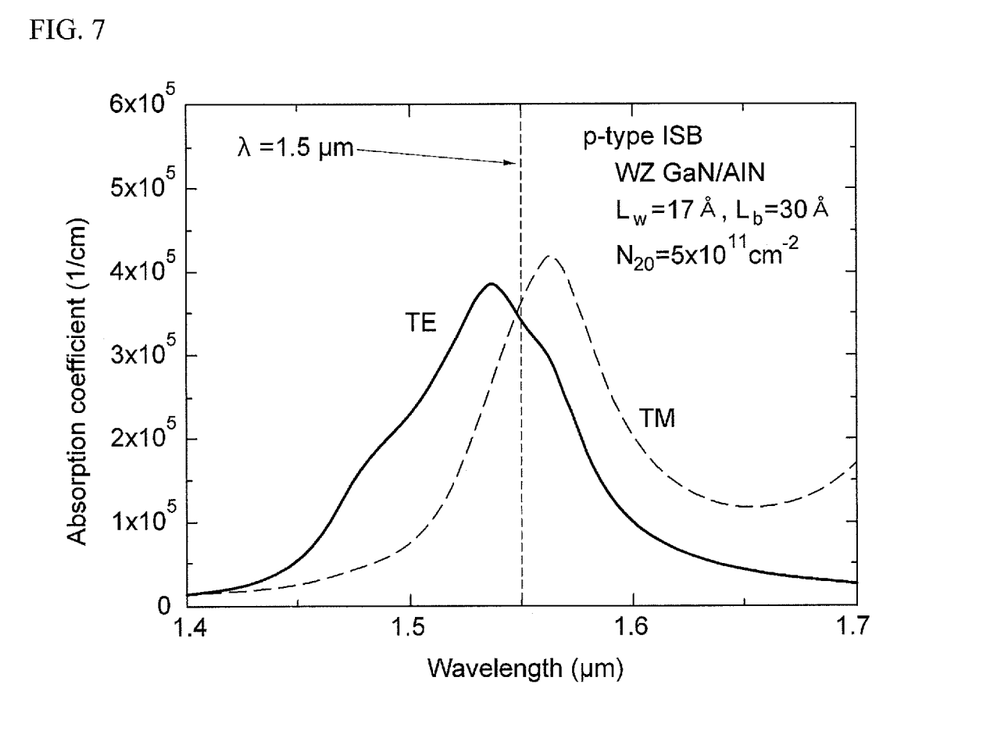
FIG. 7 is a graph illustrating an absorption coefficient of a light absorbing layer according to an embodiment of the present invention according to wavelength of light.

FIG. 7 is a graph illustrating an absorption coefficient of a light absorbing layer according to an embodiment of the present invention according to wavelength of light.

FIG. 7 specifically shows the calculation result of an absorption coefficient according to wavelength of light, when the barrier layer has a thickness of 30 Å, the well layer has a thickness of 17 Å, and the doping portions on opposite sides of the barrier layer have a charge density of $0.5 \times 10^{12}$ cm$^{-2}$.

Since the TM mode is difficult to be implemented in a general photodiode structure, the absorption coefficient according to wavelength of light in the TE mode will be examined.

In the case of the TE mode, the light absorbing layer hardly causes ISB absorption in the conduction band, but the absorption coefficient "a" in the valence band is increased to a range from about $3 \times 10^5$ cm$^{-1}$ to about $4 \times 10^5$ cm$^{-1}$ by using ISB absorption. The quantum efficiency of the photodetector is expressed as follows, $$QE=(1-r)(1-e^{-aW})$$

where "W" is a thickness of an absorbing layer, and r is a reflection coefficient when light is incident to a surface of a semiconductor. When r=0, the quantum efficiency is given by the following equation.

$$QE=1-e^{-aW}$$

Figure 8:
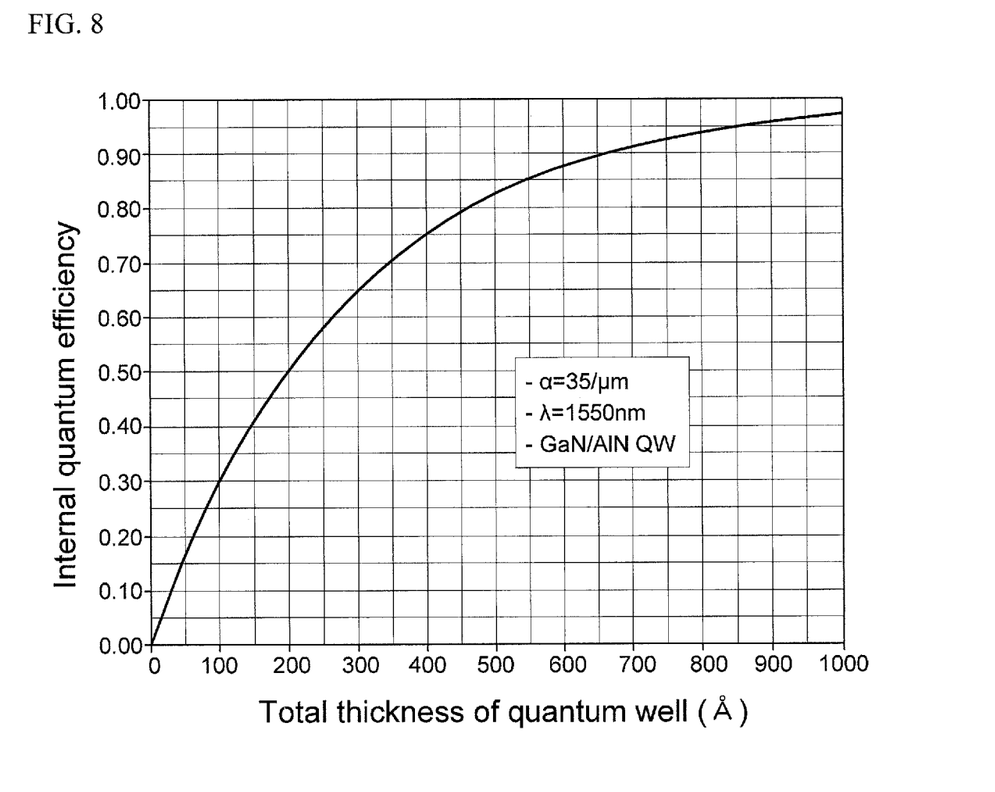
FIG. 8 is a graph showing quantum efficiency according to a total thickness of a quantum well in a GaN/AlN quantum well structure according to an embodiment of the present invention.
Figure 9:
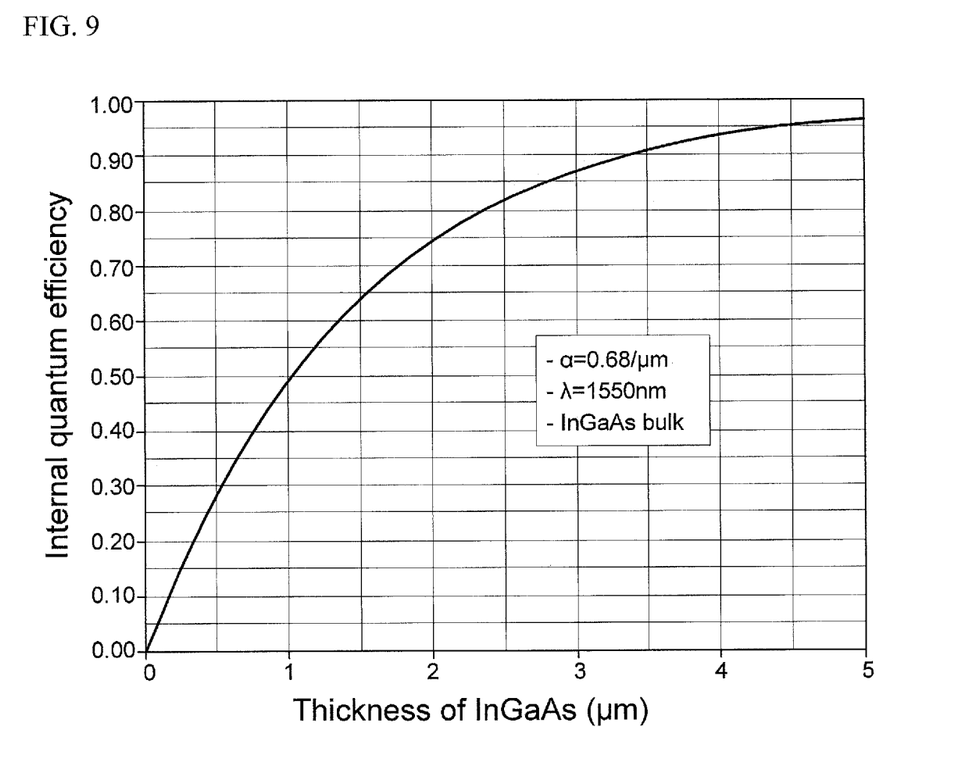
FIG. 9 is a graph showing quantum efficiency according to a thickness of an InGaAs layer.

FIG. 8 is a graph showing quantum efficiency according to a total thickness of a quantum well structure according to an embodiment of the present invention, and FIG. 9 is a graph showing quantum efficiency according to a thickness of an InGaAs layer.

FIG. 8 shows a calculated quantum efficiency according to the thickness of the multi-quantum well structure with respect to the absorption coefficient "a" of $3.5\times10^5$ cm$^{-1}$ (i.e., 35 μm$^{-1}$). It is appreciated that when the total thickness of the multi-quantum well structure of the absorbing layer according to an embodiment of the present invention is about 500 Å, since one well layer has a thickness of about 17 Å, 30 quantum wells may be formed and the quantum efficiency of about 84% or above may be obtained. Accordingly, it is preferable that the multi-quantum well structure according to an embodiment of the present invention have a thickness in a range from about 450 Å to about 1000 Å in order to achieve the quantum efficiency of about 80% or above.

In addition, since it is sufficient to have the quantum efficiency of about 50% or above in actual products, it is preferable that the multi-quantum well structure according to an embodiment of the present invention have a thickness in a range from about 200 Å to about 1000 Å. Referring to FIG. 9, it may be appreciated that the similar quantum efficiency may be obtained when an InGaAs material used for a single photon detector has a thickness substantially equal to or greater than about 2.5 μm.

As set forth hereinabove, the avalanche photodiode according to one or more embodiments of the present invention provides the following effects.

A photodetector that includes a light absorbing layer having a multi-quantum well structure according to one or more embodiments of the present invention has the following operational effects.

First, significantly high quantum efficiency may be obtained with the absorbing layer having a significantly small thickness, which is possible because a absorption coefficient of the absorbing layer is higher than an absorption coefficient of a conventional InGaAs absorbing layer by several ten times.

Second, since a GaN—AlN material system that has a significantly large band gap energy is used, thermally generated carriers may be reduced exponentially, and thus a noise due to dark currents may be substantially minimized.

Third, since the noise due to dark currents is significantly low even at room temperature, it is not necessary to use a thermoelectric cooling element, and thus the avalanche photodiode may be manufactured in a significantly low-cost packaging structure. Accordingly, the packaging cost may be greatly reduced and the manufacturing process may be simplified.

Fourth, since the noise is substantially minimized without the thermoelectric cooling element, the power consumed by the thermoelectric cooling element may be reduced, such that the operating cost may be greatly reduced.

While the present invention has been illustrated and described with reference to the embodiments thereof, it will be apparent to those of ordinary skill in the art that various changes in form and detail may be made thereto without departing from the spirit and scope of the present invention.

What is claimed is:

1. An avalanche photodiode comprising:
   a first contact layer;
   a light absorbing layer located on the first contact layer and having a multi-quantum well structure;
   a first electric field control layer located on the light absorbing layer; and
   a carrier multiplication layer located on the first electric field control layer, wherein at least one of the multi-quantum well structure comprises a well layer that comprises $Ga_{1-x}Al_xN$ (0≤X≤0.3), and a barrier layer that comprises $Ga_{1-x}Al_xN$ (0.7≤X≤1) and a doping portion doped with a p-type dopant.

2. The avalanche photodiode of claim 1, wherein the doping portion has a surface charge density in a range from about $0.1\times10^{12}$ cm$^{-2}$ to about $3\times10^{12}$ cm$^{-2}$.

3. The avalanche photodiode of claim 1, wherein the well layer has a thickness in a range from about 10 Å to about 20 Å, and the barrier layer has a thickness in a range from about 15 Å to about 40 Å.

4. The avalanche photodiode of claim 1, wherein the well layer has a band gap in a range from about 3.4 eV to about 3.959 eV, and the barrier layer has a band gap in a range from about 5.048 eV to about 6.015 eV.

5. The avalanche photodiode of claim 1, wherein the multi-quantum well structure has a thickness in a range from about 200 Å to about 1000 Å.

6. The avalanche photodiode of claim 1, wherein the carrier multiplication layer comprises $Ga_{1-x}Al_xN$ (0≤X≤1) that is not doped.

7. The avalanche photodiode of claim 1, wherein the first electric field control layer comprises $Ga_{1-x}Al_xN$ (0≤X≤1) that is p-type.

8. The avalanche photodiode of claim 1, wherein the first contact layer comprises $Ga_{1-x}Al_xN$ (0≤X≤1).

9. The avalanche photodiode of claim 1, further comprising a second electric field control layer located on the carrier multiplication layer.

10. The avalanche photodiode of claim 9, further comprising a second contact layer located on the second electric field control layer.

* * * * *